(12) United States Patent
Gao

(10) Patent No.: US 8,981,382 B2
(45) Date of Patent: Mar. 17, 2015

(54) SEMICONDUCTOR STRUCTURE INCLUDING BUFFER WITH STRAIN COMPENSATION LAYERS

(71) Applicant: IQE RF, LLC, Somerset, NJ (US)

(72) Inventor: Xiang Gao, East Brunswick, NJ (US)

(73) Assignee: IQE RF, LLC, Somerset, NJ (US)

( * ) Notice: Subject to any disclaimer, the term of this patent is extended or adjusted under 35 U.S.C. 154(b) by 0 days.

(21) Appl. No.: 13/787,018

(22) Filed: Mar. 6, 2013

(65) Prior Publication Data

US 2014/0252366 A1    Sep. 11, 2014

(51) Int. Cl.
*H01L 29/15* (2006.01)
*H01L 29/20* (2006.01)
*H01L 29/205* (2006.01)

(52) U.S. Cl.
CPC .......... *H01L 29/2003* (2013.01); *H01L 29/205* (2013.01)
USPC ........................................................ 257/76

(58) Field of Classification Search
CPC ..................... H01L 21/0237; H01L 21/02458; H01L 21/02365; H01L 21/02491; H01L 21/02494; H01L 29/1029; H01L 29/7787; H01L 29/2003; H01L 33/02; H01L 33/24; H01L 33/007
USPC .................................. 438/46, 47; 257/76, 94
See application file for complete search history.

(56) References Cited

U.S. PATENT DOCUMENTS

| | | | |
|---|---|---|---|
| 6,649,287 B2 | 11/2003 | Weeks, Jr. et al. | |
| 6,818,061 B2 | 11/2004 | Peczalski et al. | |
| 7,115,896 B2 * | 10/2006 | Guo et al. | 257/15 |
| 2007/0238315 A1 | 10/2007 | Cheng et al. | |
| 2008/0220555 A1 * | 9/2008 | Saxler et al. | 438/47 |

* cited by examiner

*Primary Examiner* — Brook Kebede
(74) *Attorney, Agent, or Firm* — Fish & Richardson P.C.

(57) ABSTRACT

A semiconductor structure includes a substrate and a semiconductor buffer structure overlying the substrate. The semiconductor buffer structure includes a semiconductor body of a gallium nitride material, and a stack of strain compensation layers. The stack of strain compensation layers includes a layer of a first semiconductor material with an in-plane lattice constant that is smaller than a lattice constant of the semiconductor body, and a layer of a second semiconductor material with an in-plane lattice constant that is greater than the lattice constant of the semiconductor body.

36 Claims, 6 Drawing Sheets

SEMICONDUCTOR STRUCTURE INCLUDING BUFFER WITH STRAIN COMPENSATION LAYERS

FIELD OF THE DISCLOSURE

This disclosure relates to semiconductor structures including buffers with strain compensation layers.

BACKGROUND

Nitride semiconductors such as gallium nitride (GaN) and related semiconductors are widely regarded as desirable wide bandgap compound semiconductors. These materials have been adopted in optoelectronic devices such as light-emitting diodes ("LEDs"), laser diodes and photodiodes, and have also been employed in non-optical electronic devices such as field effect transistors ("FETs") and field emitters. In optoelectronic devices, the wide bandgap of the material allows for emission or absorption of light in the visible-to-ultraviolet range. In electronic devices, GaN and related materials provide high electron mobility and allow for operation at very high signal frequencies.

In some applications, GaN materials are grown on a substrate. A silicon (Si) substrate, for example, is relatively inexpensive for growth of a GaN layer. A Si substrate not only has the advantages of low cost and good electrical and thermal conductivity, but also is available in larger wafer size. Further, GaN epitaxy on Si facilitates integration of microelectronics and optoeleetronics. However, it is difficult to grow single crystal GaN directly on a Si substrate because of large lattice and thermal mismatches between GaN and Si.

Likewise, differences in the lattice constant between GaN materials and other substrate materials can lead to difficulties in growing layers suitable for many applications. The difference in lattice constant may lead to the formation of defects in GaN material layers deposited on substrates. Such defects can impair the performance of devices formed using the GaN material layers.

Use of thin interlayers with in-plane lattice constants smaller than the bulk GaN material has been used to engineer the lattice and thermal mismatch of the bulk GaN layer and the Si substrate in order to obtain epitaxial growth of crack free GaN on a Si substrate. However, because the epitaxial grown interlayer with smaller in-plane lattice constants exhibits a compressive strain to the bulk GaN layer, an undesired two-dimensional electron gas (2 DEG) can be created at the interface of such interlayer and the GaN material.

SUMMARY

In one aspect, a semiconductor structure includes a substrate and a semiconductor buffer structure overlying the substrate. The semiconductor buffer structure includes a semiconductor body of it gallium nitride material, and a stack of strain compensation layers. The stack of strain compensation layers includes a layer of a first semiconductor material with an in-plane lattice constant that is smaller than a lattice constant of the semiconductor body, and a layer of a second semiconductor material with an in-plane lattice constant that is greater than the lattice constant of the semiconductor body. Preferably, the second semiconductor material with an in-plane lattice constant greater than the lattice constant of the semiconductor body compensates the strain in the first semiconductor material with an in-plane lattice constant that is smaller than a lattice constant of the semiconductor body such that there is no 2 DEG formation at the interface adjacent to the first semiconductor material with an in-plane lattice constant that is smaller than a lattice constant of the semiconductor body.

In another aspect, a semiconductor structure comprises a substrate, and a semiconductor buffer structure. The semiconductor buffer structure includes a sequence of semiconductor layers overlying the substrate. The sequence of semiconductor layers includes a bottom buffer layer and one or more stacks of strain compensation layers overlying the bottom buffer layer. Each stack of strain compensation layers includes a layer of a first semiconductor material with an in-plane lattice constant that is smaller than a lattice constant of the bottom buffer layer and a layer of a second semiconductor material with an in-plane lattice constant that is greater than the lattice constant of the bottom buffer layer.

The semiconductor buffer structure can have a relatively high sheet resistance as a result of the fact that no two-dimensional electron gas is present at any interface between two layers of the semiconductor buffer structure. In some implementations, the semiconductor buffer structure has a sheet resistance of at least 5,000 ohms/square.

Some implementations include a top buffer layer overlying the stacks of strain compensation layers and also can include one or more semiconductor layers for an operative device structure overlying the top buffer layer.

The structures described in this disclosure can, in some cases, provide enhanced characteristics for various types of semiconductor devices.

Other aspects, features and advantages will be apparent from the following detailed description, the accompanying drawings and the claims.

DETAILED DESCRIPTION

This disclosure describes semiconductor wafers and semiconductor devices that include a buffer having a dominate semiconductor body material and one or more stacks of strain compensation layers. Each stack of strain compensation layers includes at least one layer of a material with an in-plane lattice constant that is smaller than the lattice constant of the dominate semiconductor body material when the materials are substantially free of stress (i.e., free standing) and at least one layer with an in plan lattice constant that is greater than the lattice constant of the dominate semiconductor body material when the materials are substantially free of stress (i.e., free standing). Techniques for fabricating such wafers and devices are described as well.

One issue that sometimes arises in structures that incorporate a dislocation barrier structure based on gallium nitride materials (e.g., AlGaN/GaN superlattice structures) is a parasitic buffer conductance that results from the presence of a two-dimensional electron gas ("2 DEG") at the AlGaN/GaN interface in the buffer. For example, if the structure is used in a buffer for a field effect transistor (FET), piezoelectric polarization in the AlGaN layer generates charge at the interface, which can be detrimental to performance of the FET device. To address such issues, the materials of the buffer sheet should prevent formation of, or significantly reduce, the 2 DEG channel that might otherwise occur at such interfaces. This is accomplished, in some implementations, by introducing a second semiconductor material with an in-plane lattice constant greater than the lattice constant of the AlGaN layer to compensate the strain in the AlGaN layer so that the 2 DEG created the piezoelectric polarization of AlGaN is eliminated. The result is that, in some implementations, the buffer structure has a sheet resistance of at least 5,000 ohms/square. In some implementations, a buffer structure containing, for example, nitride materials as strain compensation layers can be provided as part of a semiconductor wafer or semiconductor device without introducing parasitic conduction. The strain compensation layer(s) also can provide dislocation reduction and/or strain engineering for controlling epitaxial cracks. While also retaining a majority of the bulk material as thermally conductive binary GaN rather than the alloy AlGaN, which has relatively poor thermal conductivity. As a result, a more thermally conductive and higher quality buffer can be grown on a substrate having a relatively large lattice mismatch.

Figure 1:
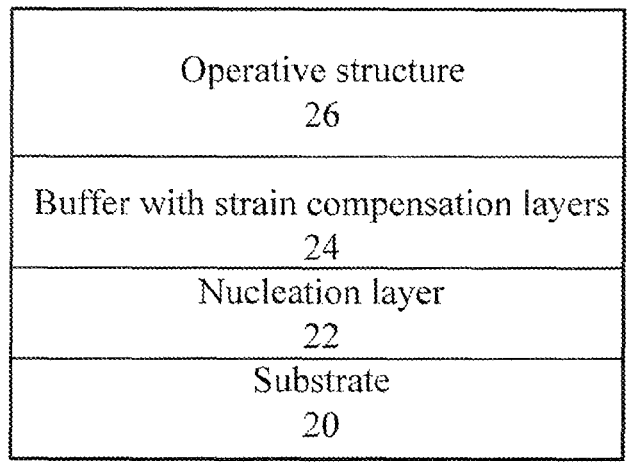
FIG. 1 shows a semiconductor structure including a buffer with strain compensation layers.

FIG. 1 shows an example of the overall structure of a semiconductor device according to some implementations. The device includes a substrate 20, which, in some implementations, is a Si substrate. The silicon substrate can be, for example, a substantially mono-crystalline Si wafer having a polished, flat top surface (e.g., the (1,1,1) crystal plane of the silicon). In some implementations, substrates of other semiconductor materials or non-semiconductor materials (e.g., glass, sapphire, SiC) can be used.

In the present disclosure, when a layer is "on," "over" or "overlying" another layer or substrate, it can be directly on the other layer or the substrate, or an intervening layer also may be present. The layer may cover the other layer or substrate entirely or may cover only a portion of the other layer or substrate.

In the illustrated example, as thin nucleation layer 22 is provided over the substrate 20. In some implementations, a thin aluminum (Al) layer may be provided directly on the Si substrate 20, and an aluminum nitride (AlN) nucleation layer may be provided on the Al layer. For example, the Si wafer can be placed in a chemical vapor deposition apparatus and exposed to an organo-aluminum compound such as trimethyl aluminum ("TMA") in vapor form for a few seconds. The aluminum compound decomposes to deposit a thin aluminum layer on the top surface of the Si wafer. The aluminum layer may include, for example, only about 1-10 mono-layers of aluminum atoms and may have a thickness less than about 100 Å. Following deposition of the aluminum layer, the substrate is exposed, for example, to a mixture of an organo-aluminum compound and ammonia, together with a carrier gas, so as to deposit as thin layer 22 of a nitride semiconductor, such as AlN. In some implementations, nucleation layer 22 has a thickness on the order of about 20-50 nm. Some implementations, however, may include a nucleation layer of a different thickness, or may not include the nucleation layer 22. In some implementations, the nucleation layer 22 has substantially the same composition throughout its thickness (i.e., it is compositionally ungraded).

A buffer 24 is provided over the nucleation layer 22. If the implementation does not include a nucleation layer 22, then the buffer 24 may be grown, for example, directly on the substrate 20. As mentioned above, the buffer 24 includes a dominate semiconductor body material and one or more stacks of strain compensation layers. The stack of strain compensation layers can include at least two layers having opposite types of stress so as to compensate for the strain between the layers. In some implementations, the buffer 24 is composed partially or entirely of gallium nitride materials provided, for example, using epitaxial growth techniques. Gallium nitride materials refer to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), among others. Further details and examples of materials for the buffer 24 are discussed below.

An operative device structure 26 is provided over the buffer 24. In some implementations, the operative device structure 26 includes, for example, one or more gallium nitride material layers and may include additional or different semiconductor materials as well. The operative device structure 26 may include a single relatively thick layer semiconductor, such as pure GaN, or multiple layers having differing compositions and or dopings as used, for example, to make conventional devices, including optical electronic devices such as light-emitting diodes, laser diodes and the like, or electronic devices such as field effect transistors and Schottky diodes. The semiconductors in the operative structure may be deposited, for example, using MOCVD techniques.

The substrate 20 and other layers described above can be further processed using conventional techniques to form individual devices, for example, by subdividing (e.g., dicing) the substrate and other layers to form individual units, and applying contacts to the resulting units and packaging the individual units. In some implementations, the substrate 20 is removed, and a different support may be provided prior to subdividing the structure into individual units for packaging.

Figure 2:
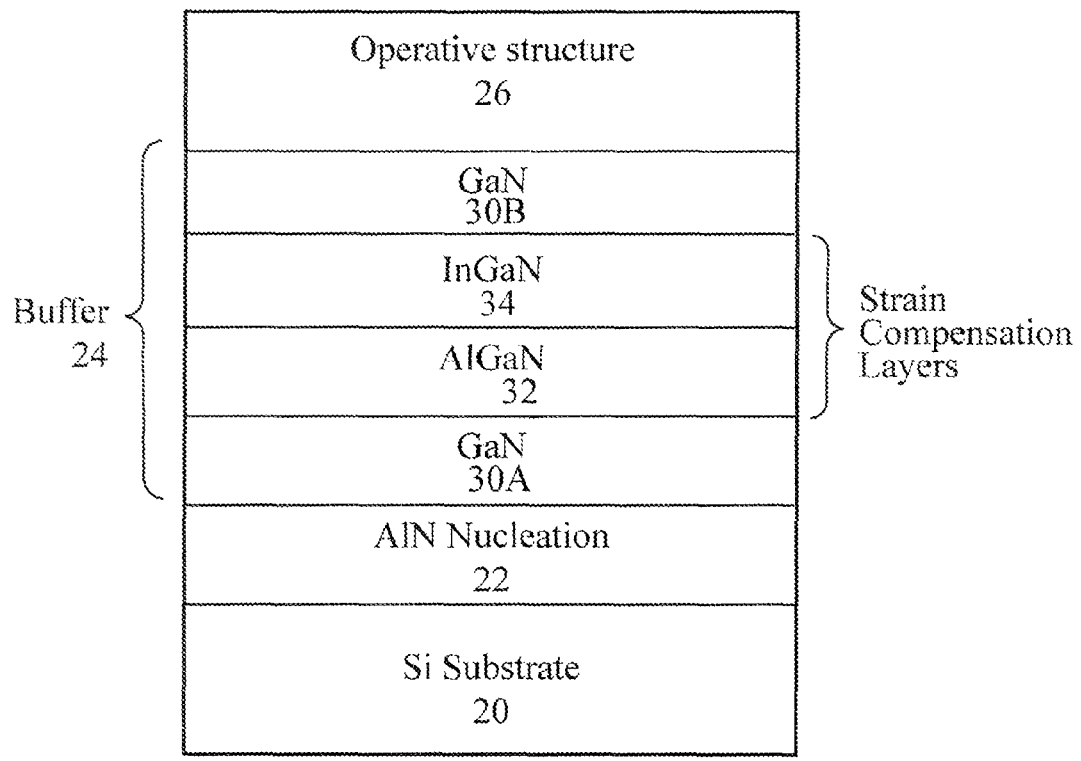
FIG. 2 shows a semiconductor structure including a particular example of a buffer with a stack of strain compensation layers.

FIG. 2 illustrates a structure that includes an example of the buffer 24 according to some implementations. In this case, an AlN nucleation layer 22 is provided on a Si substrate 20, and the buffer 24 is provided on the nucleation layer 22. In the illustrated example, the buffer 24 includes GaN layers (lower buffer layer 30A and upper buffer layer 30B) as the dominate semiconductor body material, and an AlGaN layer 32 and an InGaN layer 34 forming the stack of strain compensation layers. In this example, the AlGaN material of the layer 32 has an in-plane lattice constant that is smaller than the lattice constant of the GaN dominate semiconductor body material (i.e., for free standing materials), and the InGaN material of the layer 34 has an in-plane lattice constant that is greater than the lattice constant of the GaN dominate semiconductor body material (i.e., for free standing materials).

Figure 3:
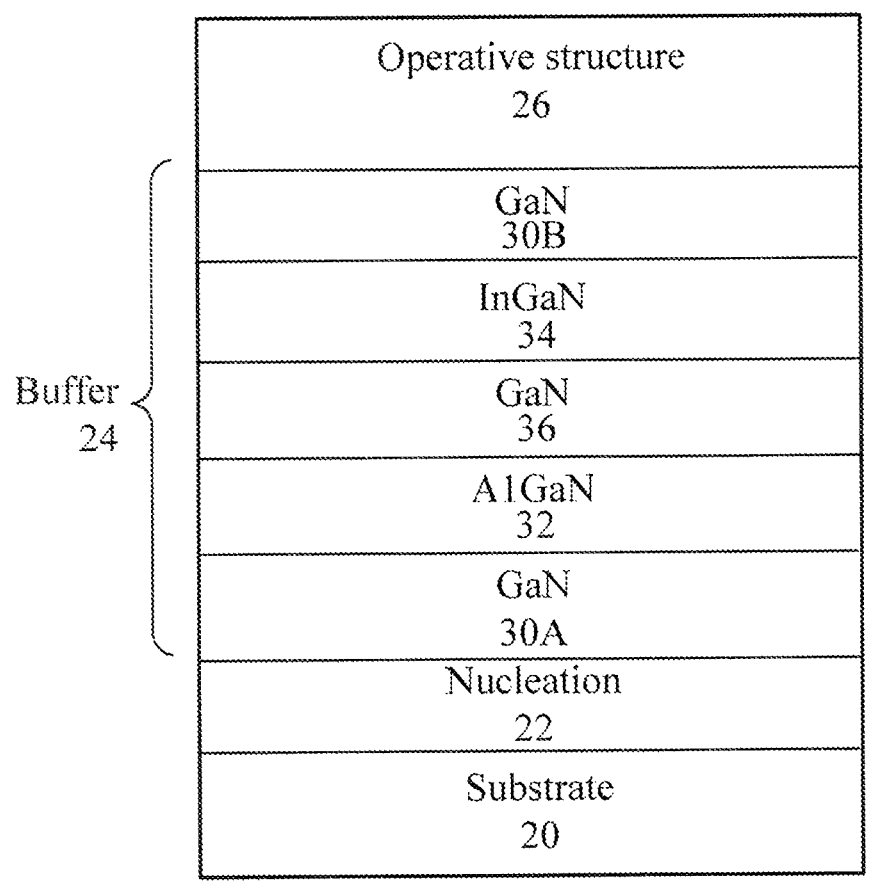
FIG. 3 shows a semiconductor structure including another example of a buffer with a stack of strain compensation layers.

FIG. 3 illustrates a structure that includes another example of the buffer 24 according to some implementations. This buffer structure is similar to the buffer structure of FIG. 2, except that an additional intermediate GaN layer 36 is grown on the AlGaN layer 32, and the InGaN layer 34 is grown on the GaN layer 36. The addition of the intermediate GaN layer 36 can help clamp and protect the crystal integrity of the other layers.

Figure 4:
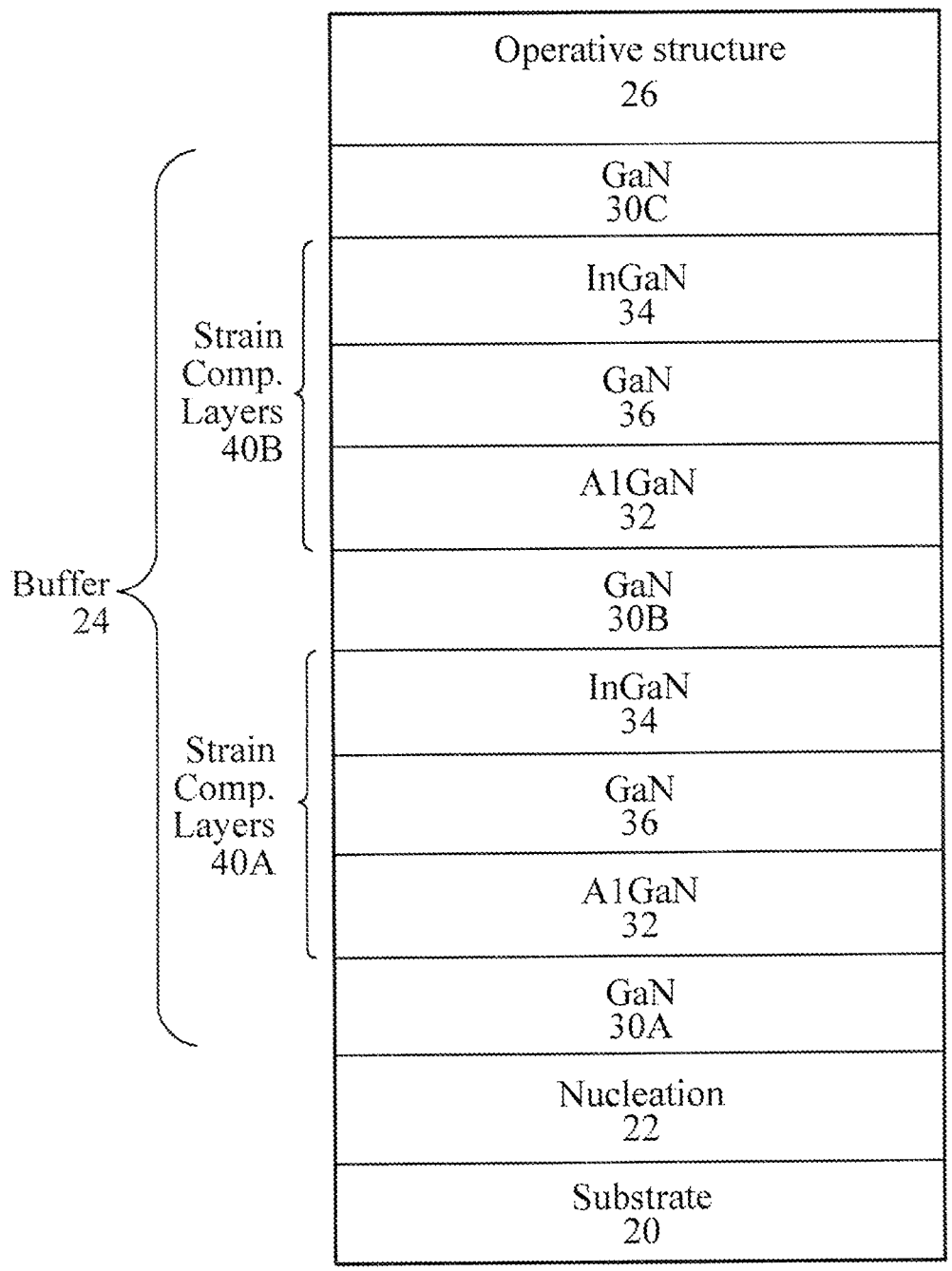
FIG. 4 shows a semiconductor structure including an example of a buffer with multiple stacks of strain compensation layers.

FIG. 4 illustrates a structure that includes another example of the buffer 24 according to some implementations. This buffer of FIG. 4 includes multiple stacks 40A, 40B of strain compensation layers. In this example, each stack 40A, 40B of strain compensation layers includes an InGaN layer 34 grown on a GaN layer 36, which is grown on an AlGaN layer 32. Each stack 40A, 40B is grown on a respective GaN buffer layer 30A, 30B, which forms part of the dominate semiconductor body material. An upper buffer GaN layer 30C is provided over the top stack 40B of strain compensation layers.

In the structures of FIGS. 2, 3 and 4, each strain compensation stack in the buffer 24 includes a single strain compensation layer 32 and a single strain compensation layer 34. However, in some implementations, each stack (e.g., stacks 40A, 40B in FIG. 4) can be formed as a superlattice that includes multiple layers alternating, for example, between AlGaN and InGaN. In such cases, the strain compensation stack includes multiple layers that alternate between (i) a semiconductor material that has an in-plane lattice constant smaller than the lattice constant of the dominate semiconductor body material of the buffer and (ii) a semiconductor material that has an in-plane lattice constant greater than the lattice constant of the dominate semiconductor body material of the buffer. The alternating layers of AlGaN and InGaN in the buffer 24 can release the build-up of stress in the buffer 24 so as to improve buffer integrity and quality and reduce wafer warpage. Removal of piezoelectric polarization in the AlGaN layers through the strain compensation InGaN layers can result in the diminishing of parasitic conductive channels at the AlGaN/GaN interfaces. Thus, high buffer resistivity can be maintained.

Figure 5:
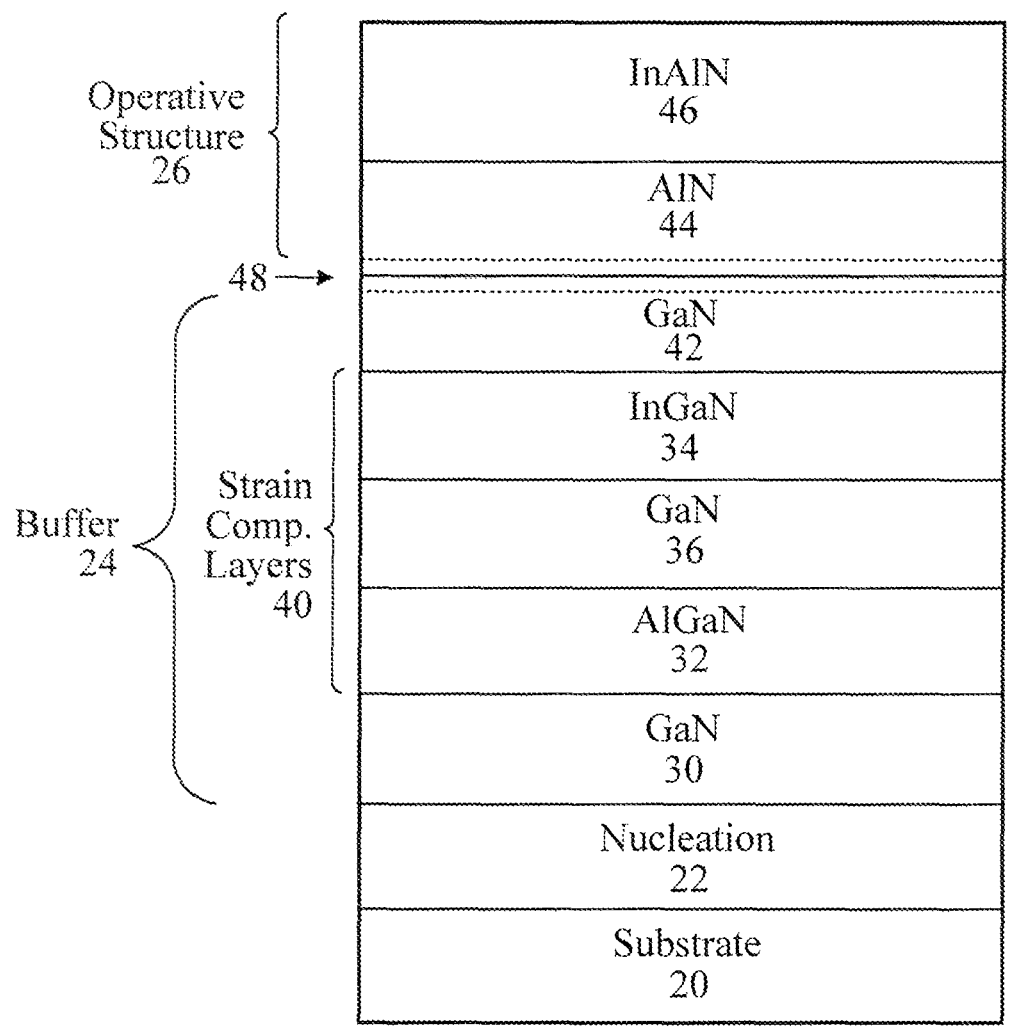
FIG. 5 shows a semiconductor structure including a particular example of operative device structure layers.

A particular example of a device that incorporates strain compensation layers as described in this disclosure is shown in FIG. 5, which illustrates an InAlN-based HEMT device that includes a buffer structure 24 including a stack 40 of InGaN/GaN/AlGaN strain compensation layers 34, 36, 32 grown epitaxially on a bottom GaN buffer layer 30. A top GaN buffer layer 42 is epitaxially grown on the InGaN layer 34. The operative device structure 26 for the HEMT device includes an AlN layer 44 and an InAlN layer 46, which serve as electron injection layers. In other implementations, the operative device structure 26 can include different or additional layers.

A two-dimensional electron gas forms at or near the interface 48 between the AlN layer 44 and the GaN top buffer layer 42, which serves as a channel layer. To prevent or limit polarization-induced charges at other interfaces within the buffer 24, the layers above the substrate 20 and below the operative device structure 26 (i.e., the buffer layer 24 and, if present, nucleation layer 22) should have a sufficiently high sheet resistance as a result of the strain compensation so that no two-dimensional electron gas forms, for example, at the AlGaN/GaN interfaces in buffer layer 24. The thickness of each layer in the buffer layer 24 and the percentages of aluminum (Al) and indium (In) can be chosen to obtain the desired sheet resistance.

Figure 6:
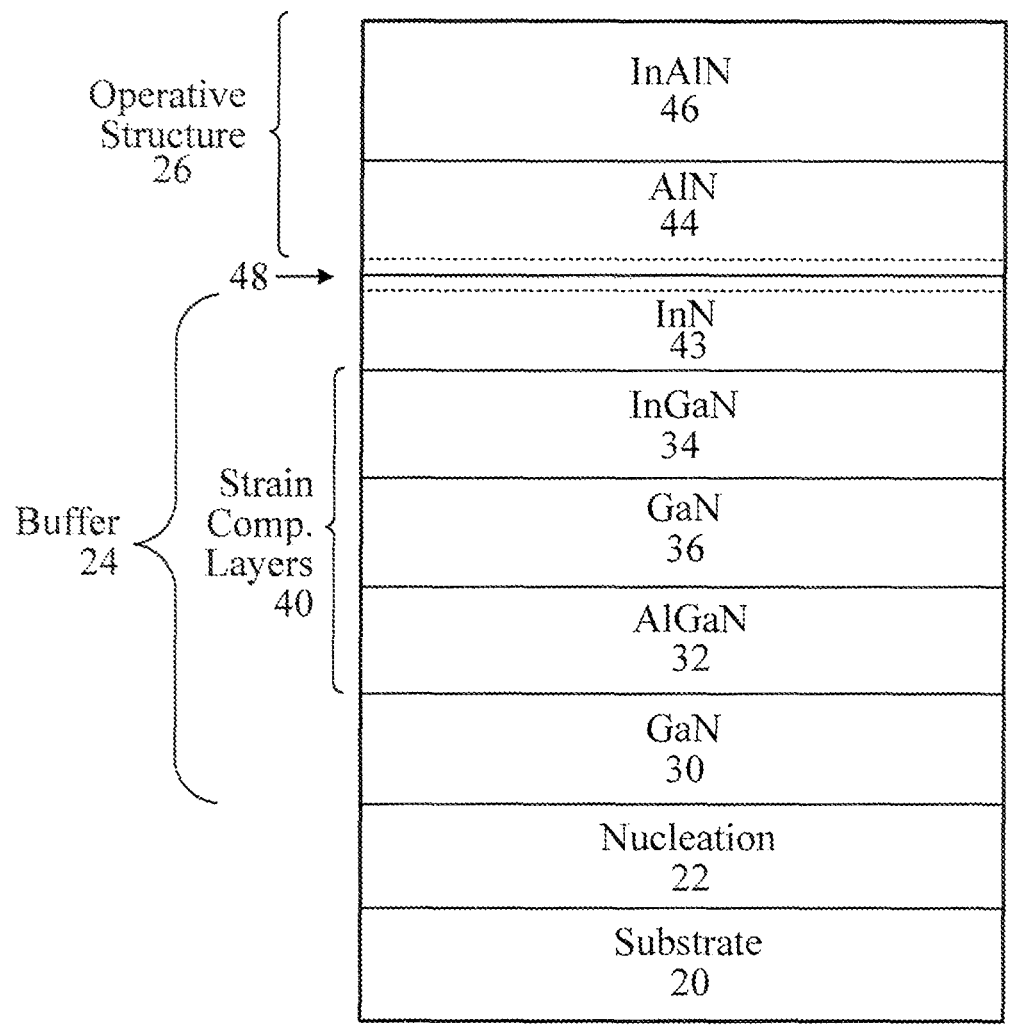
FIG. 6 shows another semiconductor structure including a particular example of operative device structure layers.

FIG. 6 illustrates another example of a structure for InAlN-based HEMT device, instead of the upper GaN buffer layer 42 of FIG. 5, the structure of FIG. 6 includes an InN top buffer layer 43, which serves as the channel layer. Here too, to prevent or limit polarization-induced charges at other interfaces within the buffer 24, the layers above the substrate 20 and below the operative device structure 26 (i.e., the buffer layer 24 and, if present, nucleation layer 22) should have a sufficiently high sheet resistance as a result of the strain compensation so that no two-dimensional electron gas forms, for example, at the AlGaN/GaN interfaces in buffer layer 24. The thickness of each layer in the buffer layer 24 and the percentages of aluminum (Al) and indium (In) can be chosen to obtain the desired sheet resistance. In other implementations, the operative device structure 26 can include different or additional layers.

In the illustrated examples of FIGS. 5 and 6, the combination of the narrow bandgap InGaN material 34 and the wide bandgap AlGaN material 32 also can serve to create a back barrier to the GaN top buffer layer 42 (or InN top buffer layer 43). If InN is used as the material for the top buffer layer 42 (see FIG. 6), the InN layer also can provide strain compensation to the AlGaN layer 32. The critical thickness of the InN channel layer 42 can be increased and the quality of the InN can be improved by engineering the composition and thickness of the AlGaN layer 32.

A δ-doping using, for example, a n-type dopant such as Si, can be added in any part of the region between the AlN barrier layer 44 and the AlGaN back-barrier/strain compensation layer 32 so as enhance the charge density and suppress the possible positive charge buildup at the interface between the InGaN layer 34 and the underlying GaN layer 36 (or if the GaN layer 36 is omitted, then at the interface between the InGaN layer 34 and the underlying AlGaN layer 32).

Figure 7:
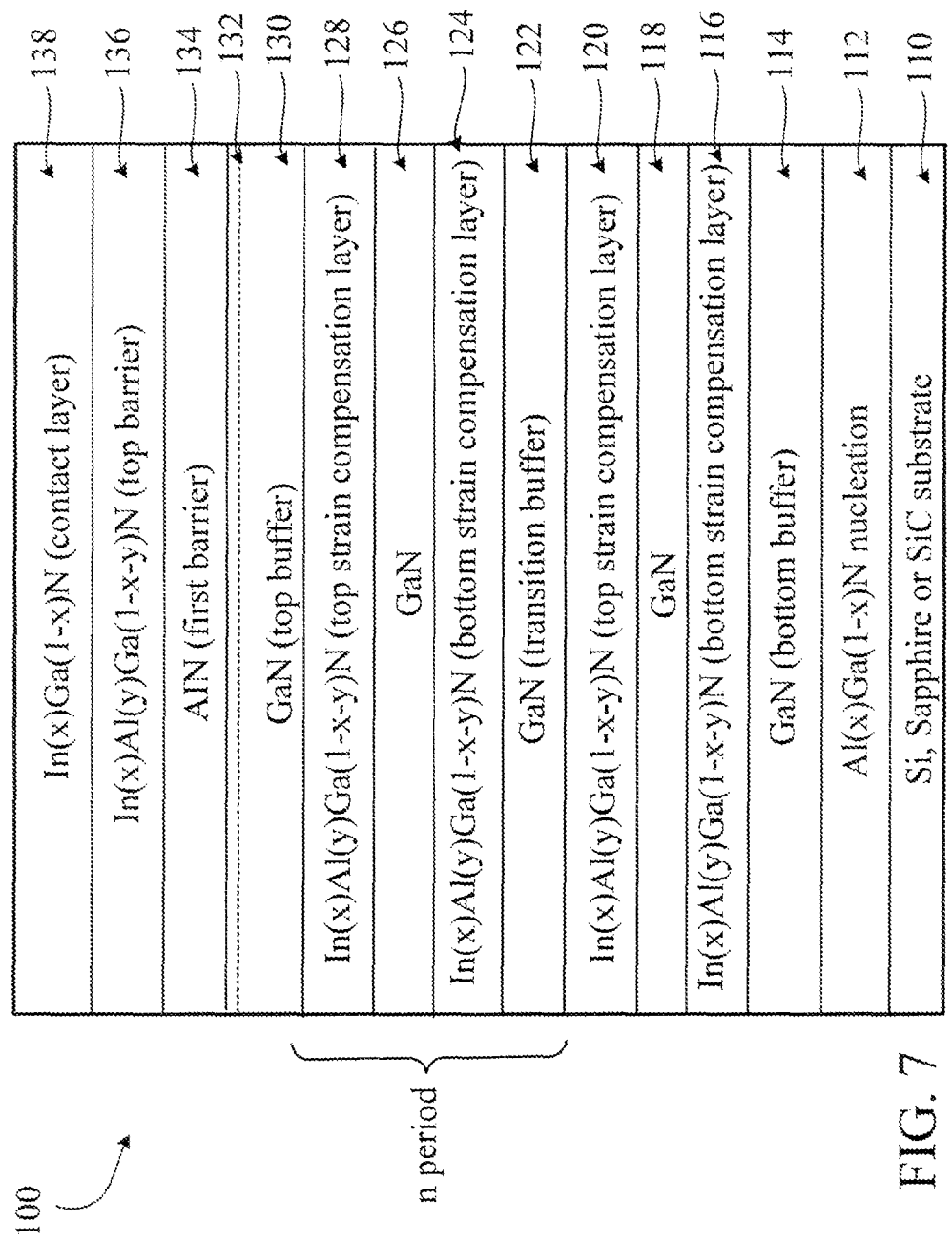
FIG. 7 shows another example of a semiconductor structure including a particular a buffer with stacks of strain compensation layers.

FIG. 7 illustrates an example of a semiconductor device that includes a buffer layer with multiple stacks of strain compensation layers. In this example, a sequence of semiconductor layers is provided on a substrate 110, for example, a silicon (Si), sapphire or silicon carbide (SiC) substrate. In these examples, the substrate 110 is lattice mismatched to the subsequently grown buffer GaN buffer layer(s). The various layers can be formed by any known techniques, including, for example, epitaxial growth techniques. First, a $Al_xGa_{(1-x)}N$ (where 0<x<1) nucleation layer 112 is provided on the substrate 110. In this example, the nucleation layer 112 is not graded (i.e., x is substantially constant throughout the thickness of the nucleation layer). Then a bottom GaN buffer layer 114 is grown over the nucleation layer 112. Next, a first stack of strain compensation layers is grown. The first stack of strain compensation layers includes a bottom $Al_{(x)}Al_{(y)}Ga_{(1-x-y)}N$ strain compensation layer 116 and a top $Al_{(x)}Al_{(y)}Ga_{(1-x-y)}N$ compensation layer 120 (where 0<x,y<1), with a GaN layer in between 118. One of the bottom or top strain compensation layers 116, 120 has a lattice constant that is larger than the lattice constant of the bulk GaN buffer material (i.e. the GaN bottom buffer 114), whereas the other one of the compensation layers 116, 120 has a lattice constant that is less than the lattice constant of the bulk GaN buffer material. In the illustrated example, the thickness of the intermediate GaN buffer layer 118 between the top and bottom strain compensation layers is 100 nm or less. In some implementations, the thickness of the GaN buffer layer 118 may be more than 100 nm, and in some implementations, the GaN buffer layer 118 may be omitted.

One or more additional stacks of strain compensation layers can be provided over the first strain compensation stack. In the example of FIG. 7, one additional stack of strain compensation layers is grown, with a GaN transition buffer layer 122 separating the additional stack of strain compensation layers from the first stack of stain compensation layers. In the illustrated example, the thickness of the GaN transition buffer layer 122 is greater than 100 nm. The additional stack of strain compensation layers includes a bottom $Al_{(x)}Al_{(y)}Ga_{(1-x-y)}N$ strain compensation layer 124 and a top $Al_{(x)}Al_{(y)}Ga_{(1-x-y)}N$ compensation layer 128 (where 0<x,y<1), with a GaN layer 126 in between. As in the first stack of strain compensation layers, one of the bottom or top strain compensation layers 124, 128 has a lattice constant that is larger than the lattice constant of the bulk GaN buffer material (i.e., the GaN bottom buffer 114), whereas the other one of the compensation layers 124, 128 has a lattice constant that is less than the lattice constant of the bulk GaN buffer material. In the illustrated example, the thickness of the intermediate GaN buffer layer 126 is 100 nm or less. In some implementations, the thickness of the intermediate GaN buffer layer 126 may be more than 100 nm, and in some implementations, the GaN buffer layer 126 may be omitted. Some implementations may include additional stacks of strain compensation layer, each of which is separated from the preceding stack of strain compensation layers by a transition buffer layer having a thickness of 100 nm or more.

As shown in FIG. 7, a top GaN buffer layer 130 is grown over the second stack of strain compensation layers. If more than two stacks of strain compensation layers are provided, then the top GaN buffer layer 130 would be grown on the last stack of strain compensation layers. Each stack of strain compensation layers includes a first strain compensation layer having a lattice constant that is larger than the lattice constant of the bulk gallium nitride buffer material and a second strain compensation layer having a lattice constant that is less than the lattice constant of the bulk gallium nitride buffer material. After completion of the buffer structure, there should be limited polarization induced charges at any of the interfaces from the nucleation layer 112 through the top buffer layer 130. Preferably, the sheet resistance of the buffer structure (and the nucleation layer 112 is present) should be greater than 5,000 ohms square.

One or more semiconductor layers subsequently are grown sequentially over the top GaN buffer layer 130 to provide the layers for the operative device structure. As illustrated in the example of FIG. 7, these layers include a AlN first barrier layer 134 grown on the top GaN buffer layer 130, a top $In_{(x)}Al_{(y)}Ga_{(1-x-y)}N$ barrier layer 136 (wherein 0<x,y<1), and an $In_{(x)}Ga_{(1-x)}N$ contact layer 138 (wherein 0<x,y<1). In the illustrated example, the first barrier layer 132 has a thickness of less 10 nm, and the two-dimensional electron forms at the interface 132 between the AlN barrier layer 132 and the top GaN buffer layer 130. In some implementations, the first barrier layer 132 and/or the contact layer 136 is omitted. If the first barrier layer 134 is omitted, then the two-dimensional electron forms at the interface between the top barrier layer 136 and the top GaN buffer is 130. For implementations in which the contact layer 138 is present, the percentage of indium (In) in the contact layer 138 should be significantly greater than the percentage of In in the top barrier layer 136, or the percentage of aluminum (Al) in the contact layer 138 should be significantly less than the percentage of Al in the top barrier layer 136, or both.

Some implementations may vary in the composition or thickness of various layers. For example, in some implementations, the bottom strain compensation layer may have a thickness of between about 0.5 nm to 100 nm and may be composed of $Al_xGa_{(1-x)}N$ (where 0<x<1), or may be composed of $In_xAl_yGa_{(1-x-y)}N$ (where 0<x<0.15; 0<y<1). In some implementations, the bottom strain compensation layer may have a thickness of between about 5 nm to 30 nm and may be composed of $Al_xGa_{(1-x)}N$ (where 0.1<x<0.4). In other implementations, the bottom strain compensation layer may be a superlattice composed of alternating layers of $In_xAl_yGa_{(1-x-y)}N$ (where 0<x<0.15; 0<y<1) and GaN, where each layer in the superlattice has a thickness between about 0.5 nm and 100 nm.

In some implementations, the top strain compensation layer may have a thickness of between about 0.5 nm to 100 nm and may be composed of $In_xGa_{(1-x)}N$ (where 0<x<1), or may be composed of $In_xAl_yGa_{(1-x-y)}N$ (where 0<x<1; 0<y<0.85). In some implementations, the top strain compensation layer may have a thickness of between about 0.5 nm to 30 nm and may be composed of $In_xGa_{(1-x)}N$ (where 0.005<x<0.2). In other implementations, the top strain compensation layer may be a superlattice composed of alternating layers of $In_xAl_yGa_{(1-x-y)}N$ (where 0<x<1; 0<y<0.85) and GaN, where each layer in the superlattice has a thickness between about 0.5 nm and 100 nm.

The particular compositions and thicknesses mentioned above for the bottom and top strain compensation layers in each stack may be reversed. In some implementations, the two-dimensional electron gas is located at the interface between the top barrier 130 and the contact layer 138, rather than at the interface between the top buffer layer 130 and the first barrier layer 134.

Semiconductor wafers including a sequence of layers as described above can be processed further using standard fabrication techniques to form one or more active and passive electronic devices. For example, the wafer can be processed further using various photolithographic, etching, implantation, metallization and other processes to fabricate the active and/or passive devices in or on the semiconductor structure.

Other implementations are within the scope of the claims.

What is claimed is:

1. A semiconductor structure comprising:
   a substrate; and
   a semiconductor buffer structure overlying the substrate;
   wherein the semiconductor buffer structure comprises:
      a semiconductor body of a gallium nitride material; and
      a stack of strain compensation layers wherein the stack of strain compensation layers includes a layer of a first semiconductor material with an in-plane lattice constant that is smaller than a lattice constant of the semiconductor body of a gallium nitride material, wherein the stack of strain compensation layers includes a layer of a second semiconductor material with an in-plane lattice constant that is greater than the lattice constant of the semiconductor body of a gallium nitride material, and wherein the semiconductor buffer structure has a sheet resistance of at least 5,000 ohms/square.

2. The semiconductor structure of claim 1 wherein the semiconductor buffer structure does not include a two-dimensional electron gas at any interface between two layers of the semiconductor buffer structure.

3. The semiconductor structure of claim 1 wherein the semiconductor body comprises GaN, and wherein the stack of strain compensation layers consists essentially of gallium nitride-based materials.

4. The semiconductor structure of claim 3 wherein the first semiconductor material in the stack of strain compensation layers is AlGaN and the second semiconductor material in the stack of strain compensation layers is InGaN.

5. The semiconductor structure of claim 4 further comprising an intermediate layer of GaN between the first and second semiconductor layers of the stack of strain compensation layers.

6. The semiconductor structure of claim 3 further comprising one or more semiconductor layers over the semiconductor buffer structure forming an operative device structure.

7. The semiconductor structure of claim 6 including one or more active devices in the operative device structure.

8. The semiconductor structure of claim 3 including a nucleation layer overlying the substrate, wherein the buffer structure overlies the nucleation layer.

9. The semiconductor structure of claim 8 wherein the substrate comprises silicon.

10. The semiconductor structure of claim 1 wherein the buffer structure comprises a plurality of stacks of strain compensation layers, each of which consists essentially of gallium nitride materials, wherein each stack of strain compensation layers includes a layer of a first semiconductor material with an in-plane lattice constant that is smaller than a lattice constant of the semiconductor body and a layer of a second semiconductor material with an in-plane lattice constant that is greater than the lattice constant of the semiconductor body.

11. The semiconductor structure of claim 10 wherein the semiconductor body of the buffer structure is GaN, and wherein each stack of strain compensation layers is on a respective GaN buffer layer.

12. The semiconductor structure of claim 11 wherein the first semiconductor material in each stack of strain compensation layers is AlGaN and the second semiconductor material in each stack of strain compensation layers is InGaN.

13. The semiconductor structure of claim 12 further comprising one or more semiconductor layers over the semiconductor buffer structure forming an operative device structure that includes one or more active devices.

14. The semiconductor structure of claim 1 wherein the stack of strain compensation layers is a superlattice of alternating layers of the first semiconductor material and the second semiconductor material.

15. The semiconductor structure of claim 14 wherein the superlattice comprises alternating layers of AlGaN and InGaN.

16. The semiconductor structure of claim 15 further comprising one or more semiconductor layers over the semiconductor buffer structure forming an operative device structure that includes one or more active devices.

17. A semiconductor structure comprising:
a substrate; and
a semiconductor buffer structure comprising a sequence of semiconductor layers overlying the substrate, wherein the sequence of semiconductor layers includes a bottom buffer layer and one or more stacks of strain compensation layers overlying the bottom buffer layer, wherein each stack of strain compensation layers includes a layer of a first semiconductor material with an in-plane lattice constant that is smaller than a lattice constant of the bottom buffer layer and a layer of a second semiconductor material with an in-plane lattice constant that is greater than the lattice constant of the bottom buffer layer, and wherein the semiconductor buffer structure has a sheet resistance of at least 5,000 ohms/square.

18. The semiconductor structure of claim 17 wherein the substrate comprises silicon, silicon carbide or sapphire, and the bottom buffer layer comprises a gallium nitride material.

19. The semiconductor structure of claim 17 wherein the bottom buffer layer comprises GaN and each stack of strain compensation layers includes respective compositions of $In_xAl_yGa_{(1-x-y)}N$ as the layers of first and second semiconductor materials.

20. The semiconductor structure of claim 19 wherein each stack of strain compensation layers includes an intermediate GaN layer between the layers of first and second semiconductor materials.

21. The semiconductor structure of claim 19 comprising a plurality of stacks of strain compensation layers, wherein each stack of strain compensation layers includes respective compositions of $In_xAl_yGa_{(1-x-y)}N$ as the layers of first and second semiconductor materials.

22. The semiconductor structure of claim 21 further including a transition buffer layer of GaN disposed between adjacent stacks of strain compensation layers.

23. The semiconductor structure of claim 19 comprising:
a plurality of stacks of strain compensation layers, wherein each stack of strain compensation layers includes respective compositions of $In_xAl_yGa_{(1-x-y)}N$ as the layers of first and second semiconductor materials, each stack of strain compensation layers further including an intermediate GaN layer;
a respective transition buffer layer of GaN disposed between each pair of adjacent stacks of strain compensation layers; and
a top GaN buffer layer overlying an uppermost one of the stacks of strain compensation layers.

24. The semiconductor structure of claim 23 wherein the intermediate GaN layer has a thickness of 100 nm or less, and the transition buffer layer of GaN has a thickness greater than 100 nm.

25. The semiconductor structure of claim 23 further comprising one or more semiconductor layers over the top GaN buffer layer for an operative device structure.

26. The semiconductor structure of claim 17 including a nucleation layer overlying the substrate, wherein the buffer structure overlies the nucleation layer, which has a sheet resistance of at least 5,000 ohms/square.

27. The semiconductor structure of claim 17 wherein at least one of layers of the first or second semiconductor materials in each stack of strain compensated layers has a thickness of between 0.5 nm and 100 nm and is composed of $Al_xGa_{(1-x)}N$ (where $0<x<1$) or $In_xAl_yGa_{(1-x-y)}N$ (where $0<x<0.15; 0<y<1$).

28. The semiconductor structure of claim 17 wherein at least one of layers of the first or second semiconductor materials in each stack of strain compensated layers has a thickness of between 5 nm and 30 nm and is composed of $Al_xGa_{(1-x)}N$ (where $0.1<x<0.4$).

29. The semiconductor structure of claim 17 wherein at least one of layers of the first or second semiconductor materials in each stack of strain compensated layers is a superlattice composed of alternating layers of $In_xAl_yGa_{(1-x-y)}N$ (where $0<x<0.15; 0<y<1$) and GaN, and wherein each layer in the superlattice has a thickness between about 0.5 nm and 100 nm.

30. The semiconductor structure of claim 17 wherein at least one of layers of the first or second semiconductor materials in each stack of strain compensated layers has a thickness of between 0.5 nm to 100 nm and is composed of $In_xGa_{(1-x)}N$ (where $0<x<1$) or is composed of $In_xAl_yGa_{(1-x-y)}N$ (where $0<x<1; 0<y<0.85$).

31. The semiconductor structure of claim 17 wherein at least one of layers of the first or second semiconductor materials in each stack of strain compensated layers has a thickness of between 0.5 nm to 30 nm and is composed of $In_xGa_{(1-x)}N$ (where $0.005<x<0.2$).

32. The semiconductor structure of claim 17 wherein at least one of layers of the first or second semiconductor materials in each stack of strain compensated layers is a superlattice composed of alternating layers $In_xAl_yGa_{(1-x-y)}N$ (where $0<x<1; 0<y<0.85$) and GaN, wherein each layer in the superlattice has a thickness between 0.5 nm and 100 nm.

33. A semiconductor device comprising:
a substrate;
a semiconductor buffer structure comprising a sequence of semiconductor layers overlying the substrate, wherein the sequence of semiconductor layers includes a bottom buffer layer, one or more stacks of strain compensation layers overlying the bottom buffer layer, and a top buffer layer overlying the stacks of strain compensation layers, wherein each stack of strain compensation layers includes a layer of a first semiconductor material with an in-plane lattice constant that is smaller than a lattice constant of the bottom buffer layer and a layer of a second semiconductor material with an in-plane lattice constant that is greater than the lattice constant of the bottom buffer layer; and one or more semiconductor layers for an operative device structure overlying the top buffer layer, wherein a sheet resistance of the semiconductor buffer structure is at least 5,000 ohms/square.

34. The semiconductor device of claim 33 including a nucleation layer overlying the substrate, wherein the semiconductor buffer structure overlies the nucleation layer, and wherein a sheet resistance of nucleation layer is at least 5,000 ohms/square.

35. The semiconductor device of claim 33 wherein the top buffer layer is an InN layer that is immediately adjacent to a first free carrier providing barrier layer.

36. A semiconductor structure comprising:

a substrate; and a semiconductor buffer structure comprising a sequence of semiconductor layers overlying the substrate, wherein the sequence of semiconductor layers includes a bottom buffer layer and one or more stacks of strain compensation layers overlying the bottom buffer layer, wherein each stack of strain compensation layers includes a layer of a first semiconductor material with an in-plane lattice constant that is smaller than a lattice constant of the bottom buffer layer and a layer of a second semiconductor material with an in-plane lattice constant that is greater than the lattice constant of the bottom buffer layer, and wherein the semiconductor buffer structure has a sheet resistance sufficiently high so that a two-dimensional electron gas is not present at any interface between two layers of the semiconductor buffer structure.

\* \* \* \* \*